United States Patent
Kinsley

(10) Patent No.: US 9,255,964 B2
(45) Date of Patent: Feb. 9, 2016

(54) ELECTRONIC APPARATUS HAVING IC TEMPERATURE CONTROL

(71) Applicant: Micron Technology, Inc., Boise, ID (US)

(72) Inventor: Tom Kinsley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 121 days.

(21) Appl. No.: 14/231,864

(22) Filed: Apr. 1, 2014

(65) Prior Publication Data

US 2014/0210498 A1    Jul. 31, 2014

Related U.S. Application Data

(60) Continuation of application No. 13/251,859, filed on Oct. 3, 2011, now Pat. No. 8,692,568, which is a continuation of application No. 11/494,808, filed on Jul. 28, 2006, now Pat. No. 8,030,952, which is a division of application No. 11/196,948, filed on Aug. 4, 2005, now abandoned.

(51) Int. Cl.
    *G01R 31/00*    (2006.01)
    *G01R 31/28*    (2006.01)

(52) U.S. Cl.
    CPC ........ *G01R 31/2851* (2013.01); *G01R 31/2856* (2013.01)

(58) Field of Classification Search
    None
    See application file for complete search history.

(56) References Cited

U.S. PATENT DOCUMENTS

| | | |
|---|---|---|
| 3,235,803 A | 2/1966 | Imai et al. |
| 3,659,199 A | 4/1972 | Knutson |
| 4,078,720 A | 3/1978 | Nurnberg |
| 4,114,096 A | 9/1978 | Chinery |
| 4,165,642 A | 8/1979 | Lipp |
| 4,497,998 A | 2/1985 | West |
| 4,593,208 A | 6/1986 | Single |
| 4,661,771 A | 4/1987 | Nakamura |
| 4,734,872 A | 3/1988 | Eager et al. |
| 4,768,170 A | 8/1988 | Hoff |
| 4,999,813 A | 3/1991 | Ohtsuka et al. |
| 5,298,433 A | 3/1994 | Furuyama |
| 5,309,090 A | 5/1994 | Lipp |
| 5,406,212 A | 4/1995 | Hashinaga et al. |
| 5,414,370 A | 5/1995 | Hashinaga et al. |
| 5,483,175 A | 1/1996 | Ahmad et al. |
| 5,490,059 A | 2/1996 | Mahalingaiah et al. |
| 5,502,397 A | 3/1996 | Buchanan |
| 5,517,053 A | 5/1996 | Dietz et al. |

(Continued)

*Primary Examiner* — Minh N Tang
(74) *Attorney, Agent, or Firm* — Schwegman Lundberg & Woessner, P.A.

(57) ABSTRACT

The use of a power sink function in IC testing results in a simple and rapid method for testing ICs, and assembled modules, at elevated temperature profiles without the use of environmental ovens. Testing IC devices at elevated temperatures may be useful for 'burn-in', for 'hot sort' performance testing that may be used in electronic devices such as DRAM memory, logic, communication devices, and microprocessors. The power sink function may be implemented as an additional isolated area of active devices, or as a section of the circuit that is not involved in the testing procedure. Alternately, the power dissipation circuit may consist of a resistive path between two external pins that are not used for IC operation, where the resistor may be on the IC or on the package. This allows for control of the temperature level and profile by simple adjustment of the voltage between the two external pins.

20 Claims, 4 Drawing Sheets

(56) References Cited

U.S. PATENT DOCUMENTS

| | | |
|---|---|---|
| 5,610,529 A | 3/1997 | Schwindt |
| 5,768,570 A | 6/1998 | Kobayashi et al. |
| 5,790,780 A | 8/1998 | Brichta et al. |
| 5,927,512 A | 7/1999 | Beffa |
| 5,951,893 A | 9/1999 | Bitko et al. |
| 6,046,433 A | 4/2000 | Gross et al. |
| 6,424,142 B1 * | 7/2002 | Kato et al. ............ G11C 29/02 324/750.3 |
| 6,441,897 B1 | 8/2002 | Zeimantz |
| 6,459,292 B1 | 10/2002 | Oikawa et al. |
| 6,489,793 B2 | 12/2002 | Jones et al. |
| 6,549,026 B1 | 4/2003 | DiBattista et al. |
| 6,587,980 B2 | 7/2003 | Debenham |
| 6,644,098 B2 | 11/2003 | Cardinale et al. |
| 6,650,132 B2 | 11/2003 | Pelissier |
| 6,674,623 B1 | 1/2004 | Abe et al. |
| 6,815,643 B2 | 11/2004 | Der Ropp |
| 6,825,681 B2 | 11/2004 | Feder et al. |
| 6,861,860 B2 | 3/2005 | Maggi et al. |
| 6,866,416 B1 | 3/2005 | Mahanpour et al. |
| 6,934,645 B2 | 8/2005 | Kim |
| 6,944,567 B2 | 9/2005 | Beffa |
| 7,008,804 B2 | 3/2006 | Song et al. |
| 7,023,229 B2 | 4/2006 | Maesaki et al. |
| 8,030,952 B2 | 10/2011 | Kinsley |
| 8,692,568 B2 | 4/2014 | Kinsley |
| 2003/0214316 A1 | 11/2003 | Maggi et al. |
| 2005/0270049 A1 | 12/2005 | Kishishita |
| 2007/0030019 A1 | 2/2007 | Kinsley |
| 2007/0030020 A1 | 2/2007 | Kinsley |
| 2012/0019274 A1 | 1/2012 | Kinsley |

* cited by examiner

ELECTRONIC APPARATUS HAVING IC TEMPERATURE CONTROL

RELATED APPLICATIONS

This is a continuation of U.S. application Ser. No. 13/251,859, filed Oct. 3, 2011, now issued as U.S. Pat. No. 8,692,568, that is a continuation of U.S. application Ser. No. 11/494,808, filed Jul. 28, 2006, now issued as U.S. Pat. No. 8,030,952, which is a Divisional of U.S. application Ser. No. 11/196,948, filed Aug. 4, 2005, now abandoned, all of which are incorporated herein by reference in their entirety.

TECHNICAL FIELD

This application relates generally to semiconductor devices and device fabrication and, more particularly, to pre-heating circuits to a desired temperature prior to functional testing.

BACKGROUND

The semiconductor device industry has a market driven need to reduce the time and cost of testing electronic devices such as integrated circuits (ICs), assembled printed circuit boards (PCBs) having various IC and other electronic devices connected together on a ceramic or plastic board, and Micro electro-mechanical (MEM) devices, which may have electronic devices integrated on sensor or actuator substrates. Such testing may include function testing to determine which IC die are properly manufactured, burn in testing to determine if a functional die has what are known as infant mortality problems, hot sort testing to determine the operational speed limits of particular die so that they may be sorted into fast and slow devices, and basic reliability testing where a representative sample of manufactured die are life tested in accelerated environments to determine the expected overall failure rate. In many of these testing cases, the electronic device may have to be heated to a predetermined temperature, such as a normal long term operating temperature, prior to commencement of testing. Thus, one of the factors affecting the amount of time an IC electrical test may consume, and thus the overall cost of testing, is the need to have the IC raised, and perhaps maintained at a predetermined temperature.

It is known to use heated vacuum chucks to hold and heat IC wafers during initial function testing, and to use environmental ovens to control the temperature of packaged IC die and assembled PCBs, but such methods increase the equipment cost, tester space requirements and testing time. What is needed is a method to rapidly and accurately heat an electronic device for electrical testing.

Certain electronic devices may have a normal operating electrical current usage rate, or duty cycle, that changes greatly over relatively short periods of time, with a result that the amount of heating that may occur on the device also changes substantially. Such a device may experience what is known as thermal stress due to the constantly changing device temperature. Thermal stress may cause device package cracking with resultant exposure of the IC to environmental contaminants, and thus an accelerated failure rate. The constant flexing of joints between portions of the electronic device having different coefficients of thermal expansion (CTE) during the thermal changes may result in die to package substrate delamination and thus die failure. The CTE differences between the IC and plastic encapsulant materials during thermal changes may result in ruptured wire bond to IC connections and thus device failure. There are numerous other electronic device failure modes that may be accelerated by thermal changes, resulting in reduced device lifetime. While it is known that higher operating temperatures may cause decreased device reliability and reduced lifetime, a reduction in the amount of thermal cycling a device experiences may result in a greater improvement in the device reliability and lifetime than is lost due to the increase operation temperature. It is known to improve device reliability in high temperature cycle situations by the use of an environmental temperature controller to maintain the electronic device at a more constant temperature, but such devices consume space and electrical power.

As an illustrative example, it is known to test DRAM devices at an elevated temperature to accelerate and expose device failures which may not otherwise have been identified. One known method to preheat a DRAM prior to a test without the need for additional equipment and time, such as a environmental oven, is to use the DRAM circuitry in what may be known as a heat up mode, by repeatedly running the DRAM in auto refresh mode until the desired temperature is obtained. However, DRAMs have been forced in recent years to become lower power users by consumer demand, due to the increased number of DRAMs use in various low power products such as laptop computers, cellular telephones and personal digital assistants, all of which have power limitations since they are battery driven devices. As a result, even if a DRAM is heated up using the auto refresh mode operation prior to a burn in test, the low power consumption of the DRAM may mean that the device temperature may fall during the burn in test, thus invalidating the test.

Thus there exists a need in the art for a simple, fast and accurate method for pre-heating and/or maintaining a desired temperature or temperature profile in an electronic device for both testing and certain operational situations.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure or a micro electro-mechanical (MEM) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
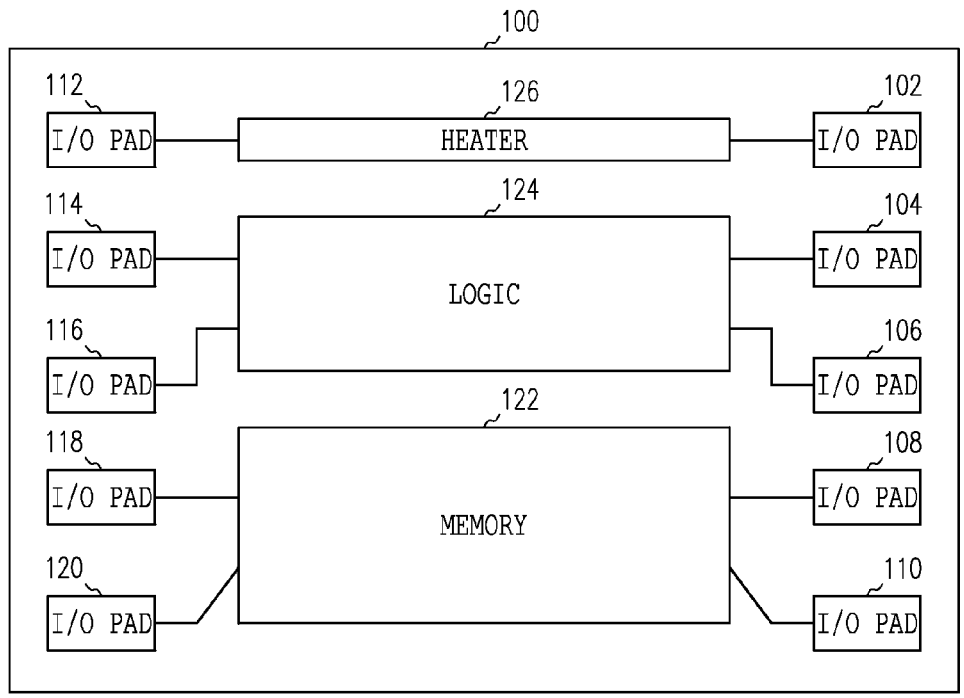
FIG. 1 illustrates an embodiment of a temperature control system.

FIG. 1 shows an embodiment of an illustrative temperature control system on an integrated circuit (IC) 100. The IC has ten exemplary input/output (IO) pads 102 to 120 arranged on two sides of the IC 100, but the present subject matter is not so limited, and may have any number of IO pads arranged on all four sides of the IC 100, or in an area array covering the entire surface of IC 100, or concentrated in a double line of IO pads located on a line traversing a median line of IC 100, or any other arrangement of IO pads. The illustrative circuit contained in IC 100 includes a memory array 122, and a logic circuit, such as an arithmetic logic unit (ALU) 124, each shown illustratively as connected to four of the IO pads. IO pads 102 and 112 are shown connected to region 126 on the IC 100. Region 126 in this illustrative embodiment of the present subject matter is an area of transistors and other active and inactive devices formed on the substrate of the IC 100 to act as a controllable IC heater for use in preheating the IC 100 prior to, or during various test procedures, or during low usage periods of the logic 124 and memory 122 sections of the IC 100. The circuitry in the IC heater section 126 may be as simple as a diffused resistor formed in the substrate of IC 100, or a metal resistor formed on a top surface of IC 100 by deposition of metals such as silicon chrome, nickel chrome, permalloy, and others well known to those of skill in the art. In such an embodiment the control over the amount and rate of heating provided by heater 126 is easily and variably controlled by the voltage directed between pads 102 and 112.

The circuitry in heater region 126 may be any form of heat dissipating circuitry, including ring oscillators, DRAM cells operated in auto refresh mode continuously as long as heating is required, or any of many other well known circuits which may be controllably operated in either an on/off mode, or operated in a more continuously variable heat generating mode, such as changing the clock rate on a logic, clock or oscillator circuit. It should be noted that the location of heater 126 on the edge of the IC 100 is not intended as a limitation on the embodiment, and alternative locations may be considered, for example with the heater 126 located between the memory array 122 and the logic 124 to provide more even heat distribution across the IC 100. Locating the heater 126 near the logic region 124 and distant from the memory 122 may be useful in normal operations if the logic region 124 is frequently left in an idle mode while waiting for information to be retrieved from the memory 122, and thus may suffer increased thermal cycling, which may cause decreased reliability. Alternatively, placing the heater section 126 next to the memory section 122 may be useful for preheating the memory 122 to an operating temperature prior to electrically testing the IC 100 for what may be known as burn in failures or infancy failures prior to shipping the IC 100 from the manufacturer. An illustrative example of a temperature range used for infancy failure testing of DRAMs is from 85 to 125° C.

The heater region 126 may not be formed as a compact region as shown in this illustrative embodiment, but may rather be a series of transistor circuits scattered around in the IC 100 to provide a more even heat distribution. The heater region 126 may also be a virtual region formed of portions of the operating circuitry of IC 100 that happen not to be used during a particular operation, such as the burn in testing of the memory arrays 122. In such an arrangement there is no lost or wasted area of the IC 100 used for the heater 126 and then not used for the normal operation of the IC 100. Such an arrangement may be useful if the IC 100 is only going to need the heater 126 during function and reliability electrical testing of the IC 100, and if space is a problem with the design of IC 100. An illustrative example of a temperature range used for burn in testing of DRAMs is 50 to 60° C.

The heater 126 may be controlled externally by applying a voltage to pads 102 and 112, or may be controlled by internal circuitry on the IC 100, using an integrated temperature sensor on the IC 100. Such a temperature sensor may be located in the region 126, and may be formed by measuring the forward bias of a diffused diode and comparing the value to either an input value provided externally through an IO pad (not shown for simplicity), or to a single value or time dependent temperature profile stored in either the memory array 122, or in another memory array (not shown for simplicity) in heater 126, or a different location on the IC 100. The applied voltage will depend upon the particular technology level of the IC 100, and may range from 0.5 to 2.2 volts on typical IC devices.

Figure 2:
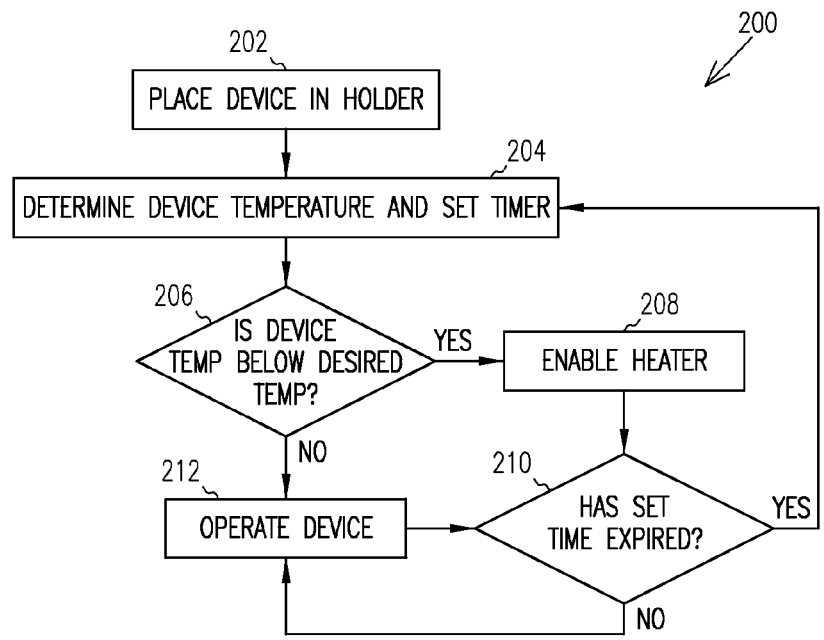
FIG. 2 shows a flow chart illustrating an embodiment of a method to control temperature of an electronic device.

FIG. 2 shows a flowchart illustrating an embodiment of a method to control the temperature of an electronic device. The method 200 includes placing the electronic device in a holder 202 that provides electrical connection and interface to the exterior of the electronic device. Such holders include wafer chucks for initial IC die function testing during or after wafer fabrication, printed circuit board (PCB) racks for holding assembled PCBs in either electrical testers, burn in testers or in operational systems such as computers, radar or telecommunications devices, or package sockets for electrical testing of finished IC packages for reliability testing or speed sorting. At 204 a measurement of the current device temperature is made and a timer clock is set to a predetermined time period. A typical initial test temperature might be a room temperature of 25° C., and the predetermined time period might be 5 seconds, depending upon how often the device temperature needs to be measured. At 206 a determination is made as to whether the device temperature is below the stored or input desired temperature, for example 55° C. If the device is below the desired temperature, which is the most likely case in an initial stage of a burn in test or reliability test situation, then the heater is enabled (for example by toggling exemplary input pad 102 of FIG. 1) at 208, until the timer expires at 210.

After the fixed time period has elapsed, the method returns to 204 where the device temperature is again measured and compared to the desired temperature (which may be the same as the first desired temperature or it may have changed) and the method repeats the steps until the device temperature is at the last desired temperature at 204. Since the device temperature is at the current desired temperature at 206, the method moves to operating the device with the heater off at 212, until the time has expired at 210, and the device temperature is again measured and compared to the current desired temperature. The described illustrative method is intended for circumstances where the device should not be operated unless the temperature is at or above the desired temperature, such as in burn in testing of DRAMs. However, a similar flow chart may be easily imagined for circumstances where the device will operate even if the temperature has not yet reached the desired temperature by adding a step to operate the device between 204 and 206.

Figure 3:
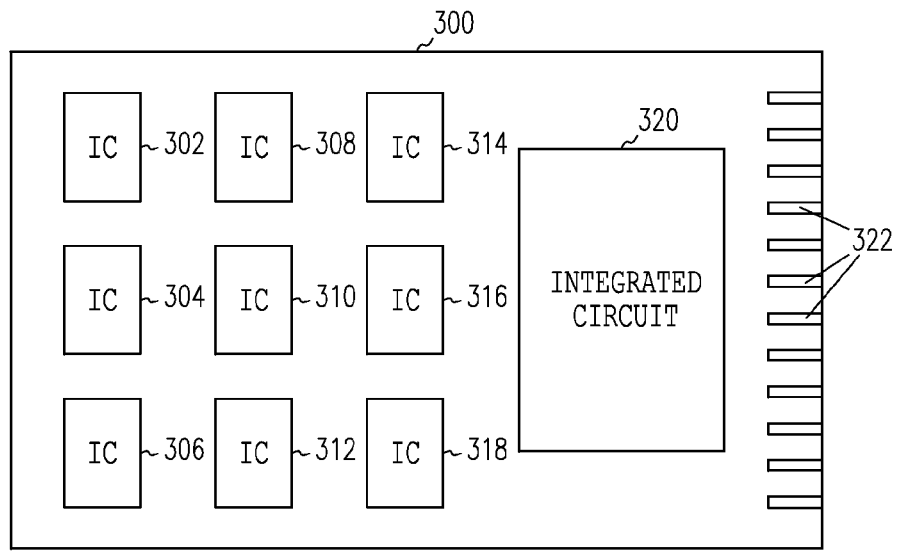
FIG. 3 illustrates an embodiment of a PCB having a temperature control system for at least some of the attached ICs.

FIG. 3 illustrates an embodiment of a PCB 300 having a temperature control system for at least some of the attached ICs 302 to 320. PCB 300 may be a single or double sided FR4 board having one or more internal and external wiring layers, or a ceramic multi chip circuit board having one or more wiring layers. In an embodiment the PCB has a number of contacts 322 for connecting the PCB to an external system, with the ICs 302 to 320 connected to each other by a plurality of wires on the surface or in the internal regions of the PCB, and to the contacts 322 by others of the same plurality of wires. The ICs 302 to 320 may be memory chips, logic chips, processor chips, sensor chips or any of the other types of ICs known in the art. An assembled PCB such as PCB 300 may have the ICs 302 to 320 attached to the PCB 300 by solder joints, or by inserting the ICs 302 to 320 into sockets attached to the PCB 300, or by direct wirebonding of unpackaged IC chips to wirebond pads on the PCB 300, or numerous other electrical and physical attachment methods well known in the art. The ICs may be packaged as through hole mount devices, such as DIP or PGA packages, as surface mount packages such as gull wing or PLCCs, as pad arrays or as direct chip mount, or other well known package methods.

The assembled PCB 300 will likely have had each of the ICs 302 to 320 tested numerous times prior to the final assembly. Typically each of the ICs 302 to 320 will have been electrically tested while still part of the wafer in which they were fabricated, then the good die will have been sawn from the wafer and assembled in the final package, and then tested again at full speed to eliminate ICs that have become faulty since being tested in the wafer, defects introduced in the packaging process, and ICs that are functional but not fast enough to meet specifications. Some of the ICs may have been operated at elevated temperatures for time periods long enough to eliminate ICs that have hidden failures likely to cause failures early in the operating life of the device, which may be called infancy failures. Such elevated temperature tests may be called a burn in. Even though essentially all of the ICs 302 to 320 have been tested numerous times previously, there is still a need to test the entire assembly on the PCB 300 to determine if there have been failures introduced in the soldering process used to assemble the board, or if there are other IC related problems, such as speed and timing interactions, that can only be revealed when used in conjunction with the other ICs. Since chip temperature affects the IC operating speed, and thus the timing interaction between the various ICs, a proper PCB electrical function test may require that some or all of the ICs 302 to 320 be heated to a normal operating temperature range before the PCB test commences. One method to obtain an operating temperature for the ICs 302 to 320 might be to place the PCB 300 in an environmental oven along with the testing fixture. This requires special equipment and takes additional time and handling. Thus some or all of the ICs 302 to 320 may beneficially be designed with the built in heater on the IC as disclosed previously.

Figure 4:
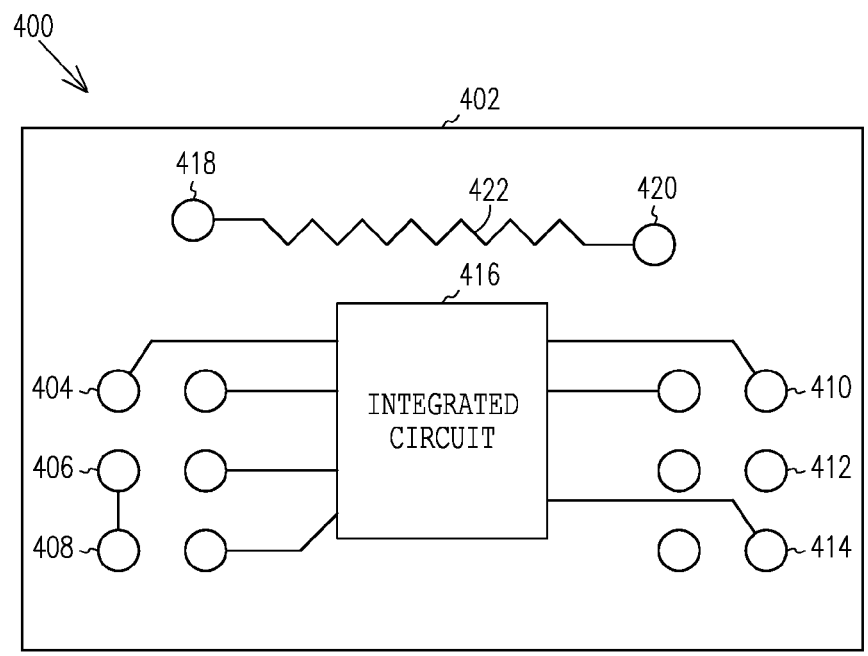
FIG. 4 illustrates an alternative temperature control system.

FIG. 4 shows an embodiment of an alternative temperature control system 400 where the heater is a part of the package rather than part of the IC as disclosed in previous embodiments. The heater system 400 has a lead frame or substrate 402 having a plurality of internal and external electrical connections illustrated as the illustrative circles 404 to 414, which provide connections between various input/output pads on the IC 416, and with the input/output connections on the package substrate 402. In one embodiment the package substrate 402 includes at least two additional connections 418 and 420, in additional to the connections required for operation and testing of the IC 416. The connections 418 and 420 have a resistor 422 disposed between them, for selectively and controllably heating the substrate 402 in circumstances where the IC 416 may require preheating or temperature variation reduction, as discussed previously. The present embodiment having the heater on the lead frame or on the package substrate may be easier and less expensive to implement than having the heater on the IC itself since the resistor may be a low technology such as discrete resistors or thick film resistor, which may be less expensive and have better tolerances and control than resistors built on the IC 416. Further, the heater on the IC may require that the IC be designed especially for the specific application, whereas the heater on the package substrate may allow the use of standard off the shelf components, which may decrease the lead time for system design and reduce costs.

Structures such as shown in FIG. 1, 3 or 4 may be used in any integrated circuit or transistor devices, such as flash memory devices as well as other memory, logic or information handling devices and systems. Embodiments of these information handling devices include wireless systems, telecommunication systems, computers, MEMs and integrated circuits.

An embodiment of the invention includes a module level tester that exercises a DRAM at an elevated die temperature without use of an external heated air supply or the consequent increased test time involved in using external heaters. An exemplary DRAM device such as the 1 Gb DDR2 SDRAM by Micron Technology, Inc., operating at 1.8 volts at 4,300 MB/sec uses so little current that during a heated function test at 55° C., the die temperature may return to 35° C. as quickly as 30 seconds after the heater is turned off. Thus, due to the low power consumption of such devices as the DDR2 SDRAMs, or high speed low latency cache memories such as the 576 Mb RLDRAM by Micron Technology, Inc., operating at 1.5 volts, or many future memory and logic devices, testing the devices at a temperature the devices are likely to see when part of a larger electroscopic system, will require the use of expensive and time consuming external heat systems.

An embodiment of the invention includes designing a circuit with at least one alternate current path on either the silicon device (such as a DRAM) or on the printed circuit board that when enabled by means of signals on selected input output pads or pins will consume power either in addition to that being consumed by normal or test operation of the circuit, or will consume power prior, during or after the circuit being operated to bring or maintain the total power dissipation, and consequently the overall circuit temperature to a desired point. The amount of power consumed may be adjusted by either controlling the number of alternate current paths, or by adjusting the operational rate of the current paths. The method of enabling the alternate current paths may be performed by setting a mode register and issuing a unique sequence of commands, or it could be initiated by toggling an external device pin not used by the normal circuit operation. In this fashion the built in heater circuitry may be operated during test procedures, or during normal device operation for either startup mode operation, or for long term temperature stability in devices having variable duty cycles.

Figure 5A:
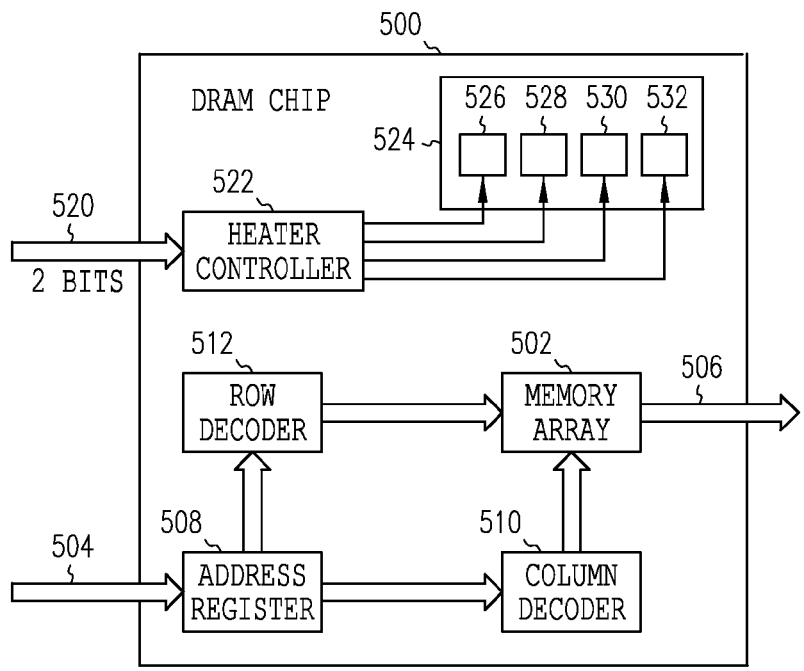
FIG. 5A is a block diagram of a DRAM with temperature control.

FIG. 5A is a block diagram of a DRAM with temperature control circuit. The use of a DRAM is not intended as a limitation on the inventive subject matter, and any electronic circuit, integrated circuit, printed circuit board or other electronic device may benefit from the described arrangement. A DRAM chip 500 having a memory array 502, controlled by an input address signal 504, has an output data signal 506. The input signal goes to an address register 508 where it is interpreted and sent to the column decoder 510 and the row decoder 512 to access the specific location of the desired data in the memory array 502. A DRAM chip 500 operates in an electronic system that dissipates power and generates heat, and thus has a normal operating temperature that may be above room temperature. To determine if a particular DRAM chip 500 will work at the normal operating temperature before the time and expense of inserting the DRAM into the final electronic system may require that the DRAM be tested at the operating temperature. Alternatively, the DRAM may be used in a situation where the usage of the section of the electronic system containing the DRAM may vary widely with time. This may be called a duty cycle variation, and may result in the electronic system having numerous thermal cycles, which may lead to failures.

In either the test case, or the normal operation case, the embodiment has a two bit input 520 to a heater function used as a power sink for thermal control of the DRAM 500. The input 520 may be separate external input pads that are toggled on and off to control the amount of heating as shown, or may be internal inputs from controllers on DRAM 500. There may be only a single input pad on the input 520 in the case of a simple resistance heater or a single stage heater circuit, but the invention is not so limited. The input 520 may be a clock to drive an oscillator circuit with a rate determined by the amount of heating desired.

The illustrated embodiment has two bits that may be set in accordance with well known methods to drive a selected one of the four illustrative heat generating circuits 526 to 532. Heat generating circuit 526 may be taken to represent a 100 ohm power sink, with circuit 528 being a 200 ohm power sink, with circuit 530 being a 300 ohm power sink, and with circuit 532 being a 400 ohm power sink. With such an arrangement it is possible to generate different desired heat sources with the use of two extra input pins. Alternatively, the number of input pins used may be increased to allow greater heat generation flexibility by allowing two or more of the heat generating circuits 526 to 532 to be operated in parallel, thus providing up to 1000 ohm power sinking with the previously described circuits.

Alternatively, the heater function input 520 may be controlled by an onboard mode register as may be found on memory products having what may be known as on die termination control, such as the DDR2 SDRAMs available from Micron Technology, Inc. Such a thermal heat function system may thus be used in either a test mode, or in a non test mode by using a unique command sequence, and the low impedance thermal power sink circuits may be formed using similar resistor and transistor circuits as those already found in the on die termination circuits.

Figure 5B:
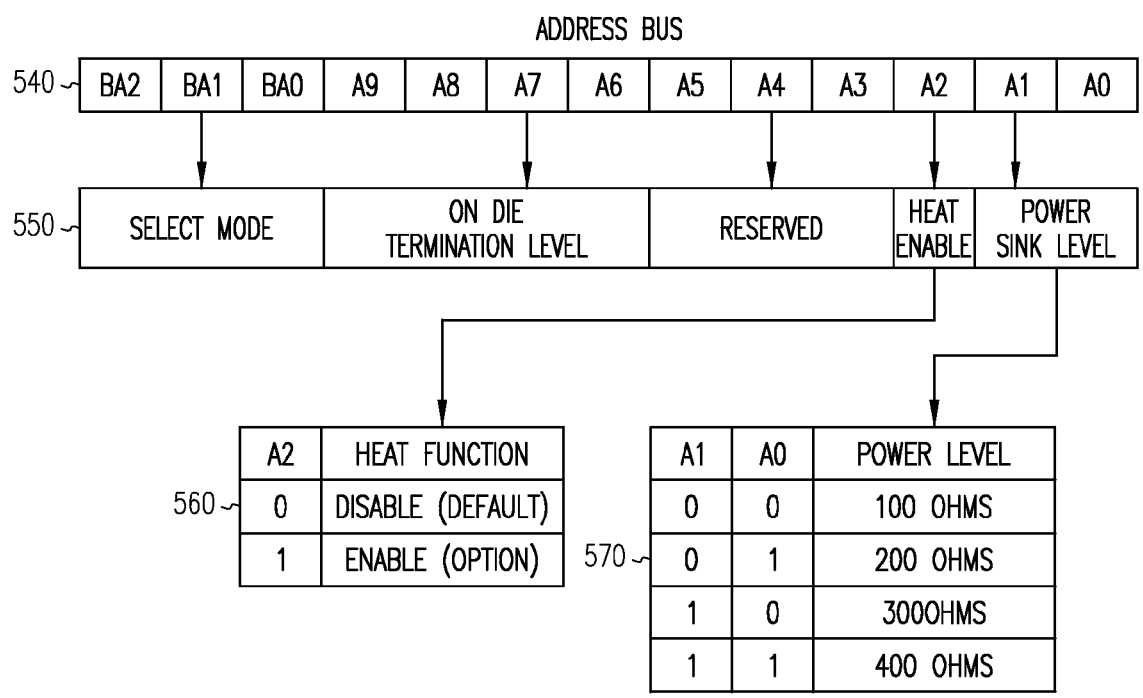
FIG. 5B is a chart showing a mode register.

FIG. 5B is chart of such a mode register having an address bus 540 with bits A0 to A9 and BA0 to BA2. The addresses in this illustrative embodiment are divided into sections 550, including a select mode to determine which on-die termination setting to use, enable the heat generation mode, and set the heat generation level or power sink level. The bit A2 is shown in this illustrative embodiment as being the one selected to determine the heat enable function 560. If the A2 bit on the address bus 540 is in the default state of zero, then the heat function is disabled. If the A2 bit on the address bus 540 is in the optional state of one, then the heat function is enabled. This may be done in either a test mode or in a non test mode of normal circuit operation. In the case where the heat function is enabled, the illustrative embodiment has two bits (A0 and A1) to determine the power sink level 570, for example which of the power dissipation circuits 526 to 532 of FIG. 5A are turned on. If both A0 and A1 are in the zero state then the 100 Ohm circuit 526 will dissipate power. If A1 is zero and A0 is one, then the 200 Ohm circuit 528 will dissipate power. If A1 has a value of 1, and A0 has a value of zero, then the 300 Ohm circuit 530 will be enabled. If both A1 and A0 have a value of 1, then the 400 Ohm circuit 532 of FIG. 5A will be enabled. Other unique command sequences may be easily imagined that could operate various combinations of the four illustrative power sink circuits 526 to 532 to obtain greater power sink flexibility. The command sequence as well as the design of the power sink circuits may be similar to those used in the on die termination circuits controlled by address bus bits A6 to A9.

Figure 6:
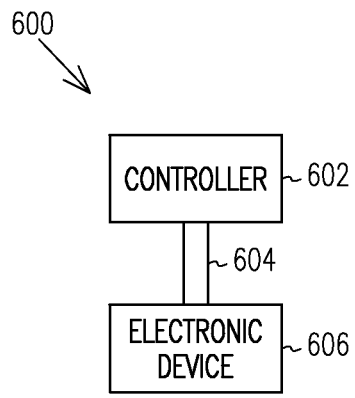
FIG. 6 is a simplified diagram of a controller coupled to an electronic device.

FIG. 6 illustrates a diagram for an electronic system 600 having one or more devices having portions of the circuits configured for selectively heating the device to a desired temperature according to various embodiments of the present invention. Electronic system 600 includes a controller 602, a bus 604, and an electronic device 606, where bus 604 provides electrical conductivity between controller 602 and electronic device 606. In various embodiments, controller 602 and/or electronic device 606 include an embodiment for a portion of the device design used for selectively heating the device to a desired temperature as previously discussed herein. Electronic system 600 may include, but is not limited to, information handling devices, wireless systems, telecommunication systems, fiber optic systems, electro-optic systems, and computers.

Figure 7:
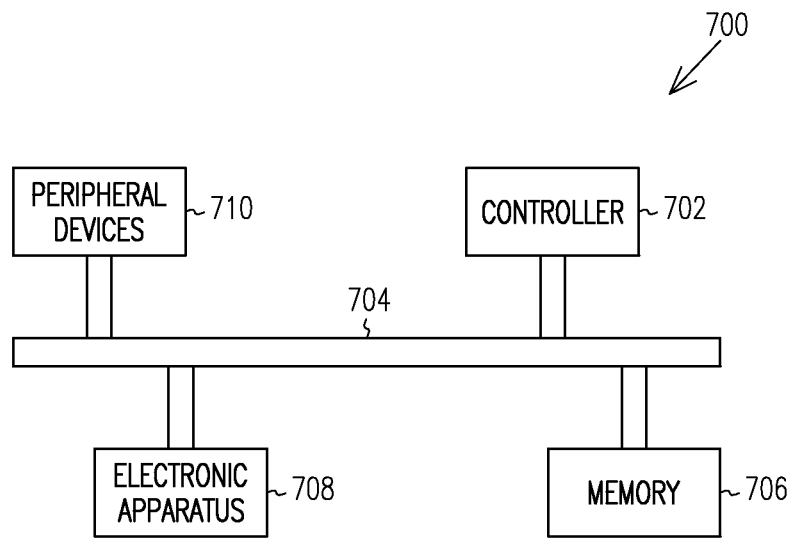
FIG. 7 is a diagram of an electronic system having devices in accordance with an embodiment of the invention.

FIG. 7 depicts a diagram of an embodiment of a system 700 having a controller 702 and a memory 706. Controller 702 and/or memory 706 includes a potion of the circuit for selectively heating the device to a desired temperature. System 700 also includes an electronic apparatus 708, and a bus 704, where bus 704 may provide electrical conductivity and data transmission between controller 702 and electronic apparatus 708, and between controller 702 and memory 706. Bus 704 may include an address, a data bus, and a control bus, each independently configured. Bus 704 also uses common conductive lines for providing address, data, and/or control, the use of which may be regulated by controller 702. In an embodiment, electronic apparatus 708 includes additional memory devices configured similarly to memory 706. An embodiment includes an additional peripheral device or devices 710 coupled to bus 704. In an embodiment controller 702 is a processor. Any of controller 702, memory 706, bus 704, electronic apparatus 708, and peripheral device or devices 710 may include a portion of the circuit, or the circuit package, for heating the device to a desired temperature for testing or normal operation at a reduced temperature variation in accordance with the disclosed embodiments. System 700 may include, but is not limited to, information handling devices, telecommunication systems, and computers. Peripheral devices 710 may include displays, additional memory, or other control devices that may operate in conjunction with controller 702 and/or memory 706.

A method is disclosed for heating a circuit for function testing, for burn in testing, for reliability testing, or for use in normal circuit operation to reduce circuit temperature fluctuations. The method includes determining a current temperature of the circuit and comparing the current temperature to a desired temperature. If the desired temperature of the circuit is greater than the current temperature of the circuit, then enabling a power dissipation portion of the circuit at a predetermined operating rate and voltage, and then redetermining a new current temperature of the circuit after a predetermined time period has expired. The power dissipation portion of the circuit may be an additional circuit that is electrically isolated from the remaining circuit, and may use different input/output (IO) pads to avoid interference. The power dissipation portion of the circuit may be beneficially placed in a central region of the circuit so that the heating is uniformly spread throughout the functional portions of the circuit. In an embodiment, the power dissipation portion may be distributed around the entire periphery of the circuit. In an embodiment, the power dissipation portion may be distributed around the periphery of the circuit as well as in selected functional portions of the circuit. The power dissipation circuit may be a resistive element connected between two external IO contact pads that are not used by any other portion of the circuit, or the power dissipation circuit may be a portion of the circuit that is not currently being used in circuit operations, such as during function testing of the circuit. The total power dissipation may be controlled by voltage across the resistive element, or by the clock rate of the circuit portion used.

The desired temperature may a burn in temperature, or a ramped hot sort temperature profile to determine the operating range of the circuit. The current temperature of the circuit may be obtained from a temperature sensor integrated as part of the circuit, such as using an isolated diode junction as a thermometer. The desired temperature of the circuit does not have to be a constant temperature, as in the example of a ramped temperature profile for operation limit testing, or in long term reliability testing of thermal cycling resistance. In normally operating ICs or assembled PCBs the desired temperature may depend upon whether the device is in sleep mode, or in a ready state. In micro electromechanical devices (MEMs) the desired temperature for a portion of the device, such as the region surrounding an oscillator, maybe a different temperature than regions having integrated circuits.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention, including but not limited to burn in testing, reliability testing, hot sort device maximum operating speed sorting, and normal device operation with temperature variation reduction. It is to be understood that the above description is intended to be illustrative, and not restrictive, and that the phraseology or terminology employed herein is for the purpose of description and not of limitation. Combinations of the embodiments will be apparent to those skilled in the art upon studying the description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method for controlling heating of a circuit, comprising:
   determining a current temperature of the circuit in a normal operational mode;
   determining a desired temperature of the circuit;
   writing a first address to a mode register of the circuit, the address comprising a heat enable bit configured to enable a heat function of the circuit; and
   when the current temperature is substantially equal to or greater than the desired temperature, writing a second address to the mode register, the second address comprising a heat disable bit configured to disable the heat function.

2. The method of claim 1, further comprising re-determining the current temperature and a new desired temperature of the circuit after a predetermined time period.

3. The method of claim 1, further comprising:
   setting bits in the mode register to enable a power sink level of the circuit at a predetermined operating rate and voltage if the desired temperature of the circuit is greater than the current temperature of the circuit.

4. The method of claim 3 wherein setting the bits in the mode register comprises writing the bits with the first or second addresses.

5. The method of claim 1, wherein determining the current temperature of the circuit comprises reading a temperature sensor integrated on a same substrate as the circuit.

6. The method of claim 1, further comprising continuing to update the desired temperature over a period of time.

7. The method of claim 1, further comprising selecting a mode of the circuit in response to writing the first address to the mode register.

8. The method of claim 1, further comprising selecting an on die termination level in response to writing the first address to the mode register.

9. A memory device comprising:
   a memory array on a substrate;
   a heater circuit on the substrate; and
   a mode register on the substrate, wherein the mode register is configured to control the heater circuit in response to an address written to the memory device.

10. The memory device of claim 9, further comprising a power dissipation portion disposed in a central region of the memory device.

11. The memory device of claim 10, wherein the power dissipation portion of the circuit further comprises a resistive element disposed electrically between at least two external contact pads not used by any other, non-power dissipation portion of the circuit.

12. The memory device of claim 10, wherein the mode register is further configured to control a power sink level of the power dissipation portion in response to the address written to the memory device.

13. The memory device of claim 10, wherein the power dissipation portion of the circuit includes a plurality of transistors connected in a circuit disposed in electrical isolation from a remaining portion of the circuit.

14. The memory device of claim 9, wherein the mode register comprises a mode select section, a termination level section, a heater enable section, and a power sink level section.

15. The memory device of claim 14, wherein the mode select section is configured to select one of a start-up mode or a test mode of the memory device in response to the address written to the memory device.

16. The memory device of claim 14, wherein the termination section is configured to control an on-die termination circuit in response to the address written to the memory device.

17. The memory device of claim 14, wherein the heater enable section is configured to enable or disable the heater circuit in response to the address written to the memory device.

18. The memory device of claim 14, wherein the power sink section is configured to set one of a plurality of power sink levels in response to the address written to the memory device.

19. The memory device of claim 18, wherein a plurality of bits of the address selects between a plurality of different resistance levels.

20. The memory device of claim 18, wherein the mode register is configured to select one of a plurality of power dissipation circuits in response to the address.

* * * * *